United States Patent
Kuo et al.

(10) Patent No.: US 6,401,810 B1
(45) Date of Patent: Jun. 11, 2002

(54) RETAINING STRUCTURE OF HEAT-RADIATING FINS

(75) Inventors: Dah-Chyi Kuo; Chen-Hsing Lee, both of Sanchung (TW)

(73) Assignee: Chaun-Choung Technology Corp., Taipei Hsien (TW)

( * ) Notice: Subject to any disclaimer, the term of this patent is extended or adjusted under 35 U.S.C. 154(b) by 0 days.

(21) Appl. No.: 09/930,222

(22) Filed: Aug. 16, 2001

(51) Int. Cl.⁷ .............................. F28F 7/00; H05K 7/20; H01L 23/34
(52) U.S. Cl. .................. 165/185; 165/80.3; 165/78; 174/16.3; 257/722; 257/718; 361/704
(58) Field of Search ................ 165/185, 80.3, 165/78; 361/703, 704; 257/722, 718; 174/16.3

(56) References Cited

U.S. PATENT DOCUMENTS

| | | | | |
|---|---|---|---|---|
| 2,434,676 A | * | 1/1948 | Spender ...................... | 165/185 |
| 5,038,858 A | * | 8/1991 | Jordan et al. ................ | 165/185 |
| 5,509,465 A | * | 4/1996 | Yaw Huey Lai ............ | 165/80.3 |
| 5,558,155 A | * | 9/1996 | Eiji Ito ....................... | 165/80.3 |
| 6,266,245 B1 | * | 7/2001 | Wen-Chen-Wei .......... | 165/80.3 |
| 6,269,003 B1 | * | 7/2001 | Wen-Chen-Wei ........... | 361/704 |
| 6,324,061 B1 | * | 11/2001 | Kinoshita et al. ........... | 361/704 |
| 6,336,498 B1 | * | 1/2002 | Wen-Chen-Wei .......... | 165/80.3 |

* cited by examiner

Primary Examiner—Henry Bennett
Assistant Examiner—Tho Van Duong
(74) Attorney, Agent, or Firm—Rosenberg, Klein & Lee (57) ABSTRACT

The present invention proposes a retaining structure of heat-radiating fins, wherein a heat-radiating part is formed by stacking a plurality of sheet type heat-radiating fins. Each of the heat-radiating fins has an upper bent portion and a lower bent portion. The two bent portions are used to form a gap, and can also be used as the joining portion between two adjacent fins. Through holes are disposed on each of the heat-radiating fins. At least a retaining tool is provided. Near two ends of the retaining tool are bent to form hook ends. The two hook ends of the retaining tool are retained in the through holes of corresponding fins to let the retaining tool straddle the bent portions of the fins. Grooves are respectively disposed at the upper and lower bent portions so that a body portion of the retaining tool can be embedded therein.

4 Claims, 8 Drawing Sheets

RETAINING STRUCTURE OF HEAT-RADIATING FINS

FIELD OF THE INVENTION

The present invention relates to a retaining structure of heat-radiating fins and, more particularly, to a structure using retaining parts to assemble heat-radiating fins.

BACKGROUND OF THE INVENTION

Figure 1:
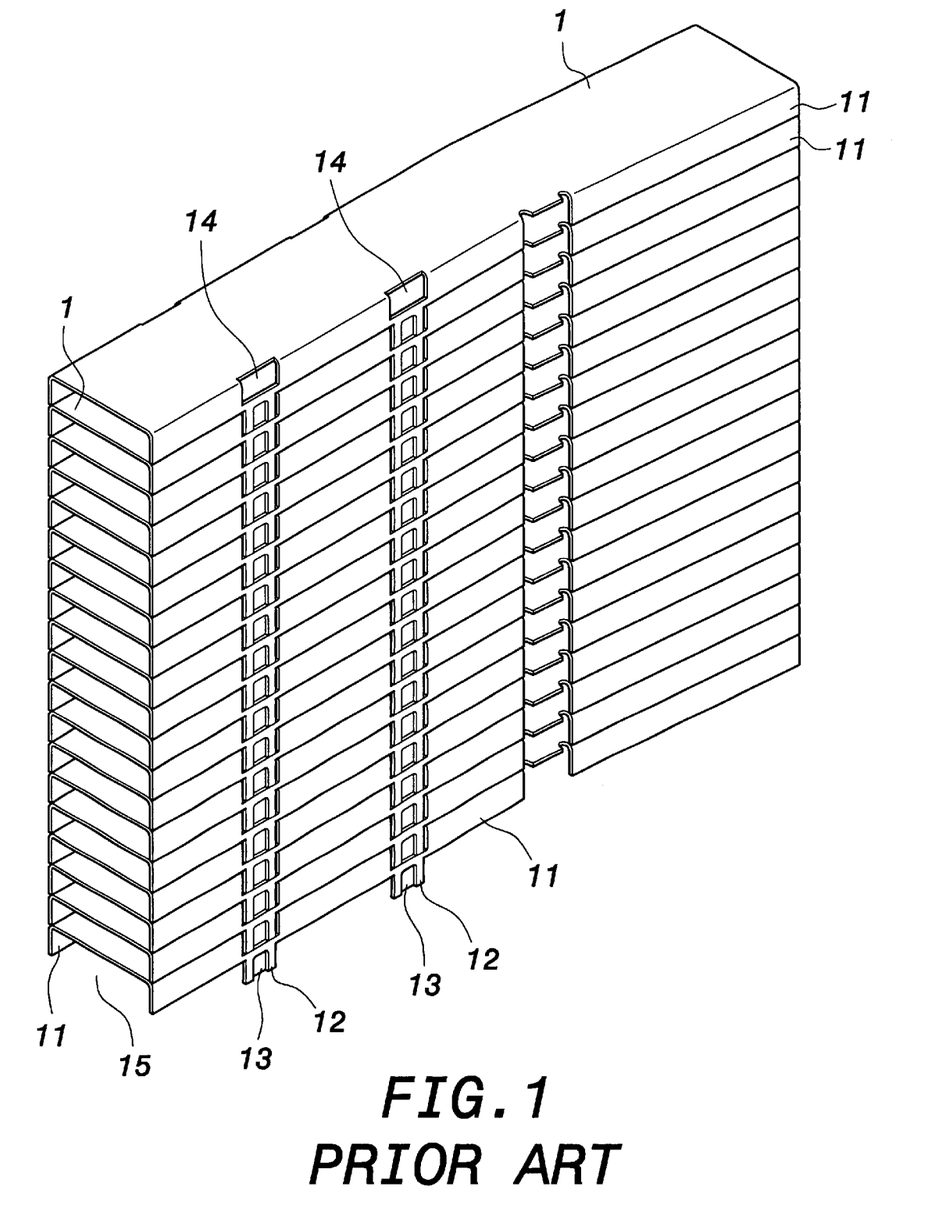
FIG. 1 is a perspective view of a prior art heat-radiating part.

As shown in FIG. 1, a heat-radiating part composed of a plurality of heat-radiating fins is formed by stacking a plurality of sheet type heat-radiating fins 1. Extension portions 11 are disposed at an upper end edge and a lower end edge of each of the radiating fins 1. The extension portion 11 is used to form the required length of a gap 15 between every two fins 1. The extension portion 11 is also used to form the joining portion between every two adjacent fins 1. Speaking more clearly, at least a prolongation end portion 12 slightly longer than the gap 15 is disposed on the extension portion 11, and the prolongation portion 12 is then embedded into an indentation 14 disposed at the extension portion 11 of an adjacent fin 1. The length of the indentation 14 is equal to that of the prolongation end portion 12, but is slightly smaller than that of the gap 15.

Tight retaining state is formed between two sides of the prolongation end portion 12 and two inner sides of the indentation 14. A projecting point 13 projects out from the prolongation end portion 12. The projecting point 13 is embedded into the indentation 14. Corresponding fastening state is formed between the prolongation end portions 12 of the extension portions 11 at two sides. A heat-radiating part is thus formed. Because the extensions 11 are formed by bending the fins I ninety degrees, if the bent angle is not exact, the assembly will not be smooth, or the retaining will not be tight, hence letting the fins be easily disjointed. Moreover, the fins will easily collapse to separate from one another due to unexpected touch in use. Also, more and larger material is required for the formation of the fin 1, and the part not required outside the prolongation end portion 12 is then removed by means of punching. Therefore, higher cost is wasted in manufacture and control.

SUMMARY OF THE INVENTION

The primary object of the present invention is to provide a retaining structure of heat-radiating fins, wherein retaining tools are used to achieve the effect of fixing a whole set of fins, thereby reducing removed part of the fins by punching and decreasing material and manufacturing cost. Additionally, when the retaining tools are joined with grooves of the fins in the present invention, smoothness of arrangement can be maintained at the periphery of two sides of the fins so that unevenness will not occur.

To achieve the above object, a plurality of sheet type heat-radiating fins are stacked to form a heat-radiating part. Each of the heat-radiating fins has an upper bent portion and a lower bent portion. A gap is formed between the bent portions. The bent portions can also be used as the joining portions between every two adjacent fins. Through holes are disposed on each of the fins of the heat-radiating part. The same number of retaining tools as that of the through holes are provided. Hook ends are bent near two ends of each of the retaining tools. The two hook ends of the retaining tools are retained in the through holes of corresponding fins to let the retaining tools straddle the bent portions of the fins. Grooves are respectively disposed at the upper and lower bent portions so that a body portion of the retaining tool can be embedded therein. The hook ends of the retaining tools can also be bent to be V shaped.

The various objects and advantages of the present invention will be more readily understood from the following detailed description when read in conjunction with the appended drawing, in which:

DETAILED DESCRIPTION OF THE PREFERRED EMBODIMENTS

As shown in FIGS. 2 to 6, the present invention provides a retaining structure of heat-radiating fins, wherein a plurality of sheet type heat-radiating fins 20 are stacked to form a heat-radiating part 2. Each of the heat-radiating fins 20 has an upper bent portion 21 and a lower bent portion 22. The two bent portions 21 and 22 form a gap 23 when two fins are stacked. Outer ends of the upper bent portion 21 and the lower bend portion 22 form the joining portion with the edge of a back face of an adjacent fin.

At least two through holes 24 are disposed on each of the heat-radiating fins 20 of the heat-radiating part 2. At least two retaining tools 3 are provided. Near two ends of the retaining tool 3 are bent near 90 degrees and then be bent again to form L-shaped hook ends 31. The two hook ends 31 face each other. The two hook ends 31 of the retaining tool 3 are retained in the through holes 24 of the corresponding fin 20 so that the retaining tool 3 can straddle the upper bent portion 21 or the lower bent portion 22 of the fin 20. The upper bent portion 21 and the lower bent portion 22 have an upper groove 25 and a lower groove 26 at positions corresponding to the retaining tool 3, respectively. Or the retaining tool does not straddle the bent portions, and the grooves are disposed at sides of the fin 20 so that a body portion 32 of the retaining tool 3 can be embedded into the groove. The hook ends of the retaining tool 3 can also be bent to form V-shaped portions 33. The V-shaped portion 33 has a distal end that can be easily held to facilitate assembly. Tips of the V-shaped portions 33 penetrate through the through holes 24 and are positioned there to form a retaining state.

Figure 2:
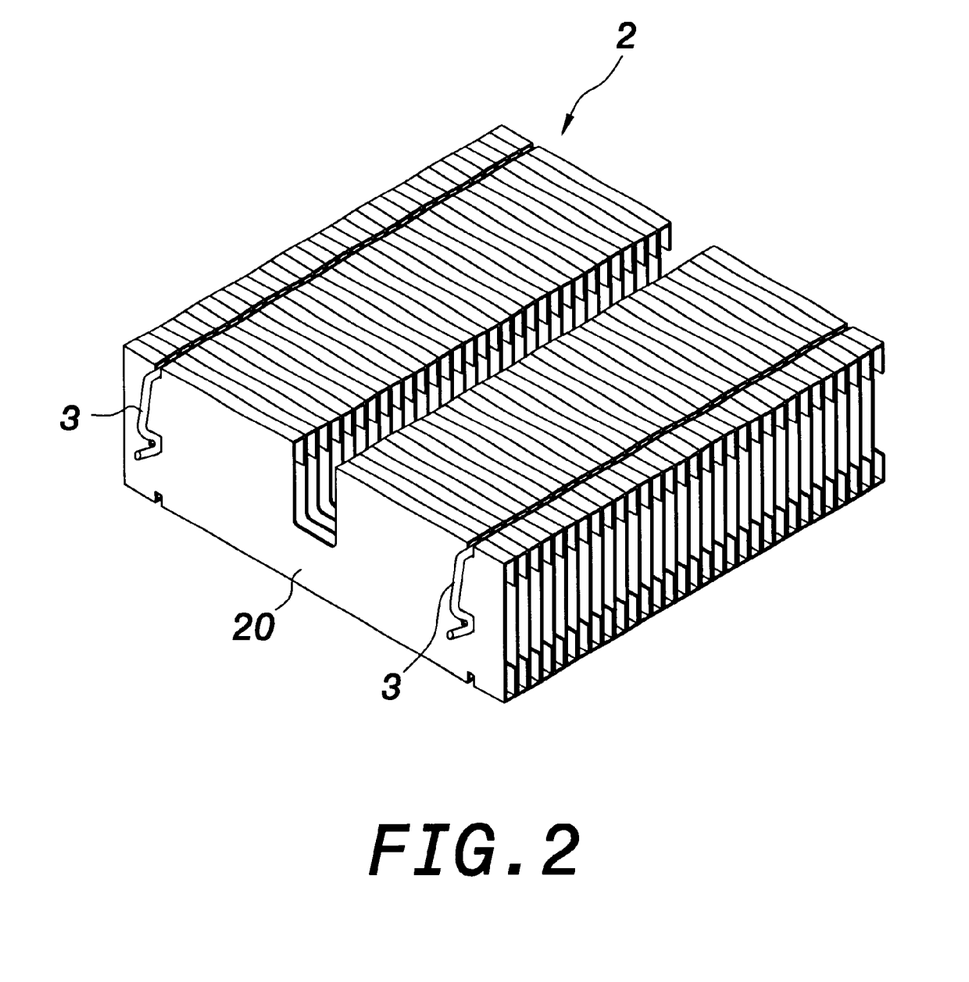
FIG. 2 is a perspective view of a thin type heat-radiating part of the present invention.
Figure 3:
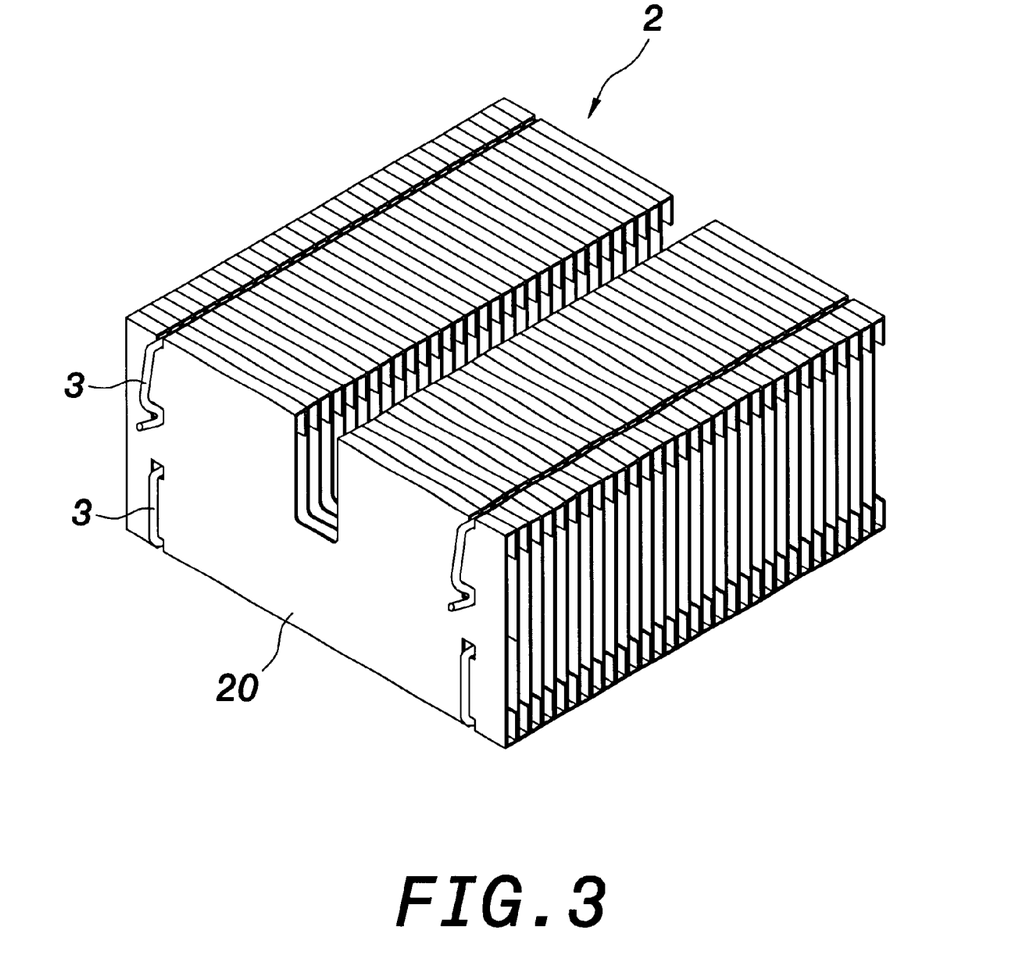
FIG. 3 is a perspective view of a thick type heat-radiating part of the present invention.

FIG. 2 shows a thin type heat-radiating part, while FIG. 3 shows a thick type heat-radiating part. Their difference lies in fins of different heights. In other words, the thin type heat-radiating part is limited in use of space so that only two retaining tools can be disposed at the left and right sides, respectively. Because the thick-type heat-radiating part has an adequate surface area, and the whole firmness needs to be enhanced, four retaining tools 3 are disposed at the left and right sides of the bent portions 21 and 22, respectively.

The widths of the grooves 25 and 26 are slightly larger than or equal to that of the body portion 32 of the retaining tool 3. Because one end of the retaining tool 3 is first retained in the through holes of the fins at one side of the heat-radiating part, when the retaining tool 3 moves along the heat-radiating part toward the fins at the other side and straddles them, the retaining tool 3 can penetrate through the grooves 25 and 26 of the corresponding fins 20 one after another so that the fins 20 can move one after another to naturally accomplish action of alignment. Otherwise, the other end of the retaining tool cannot achieve the effect of assembling and positioning. The two hook ends of the retaining tool 3 are positioned and retained in the through holes 24, respectively. Each of the fins 20 can have through holes 24 to facilitate assembly. Moreover, the counts of the fins 20 and the gaps 23 match the length of the body portion 32 of the retaining tool 3.

Figure 4:
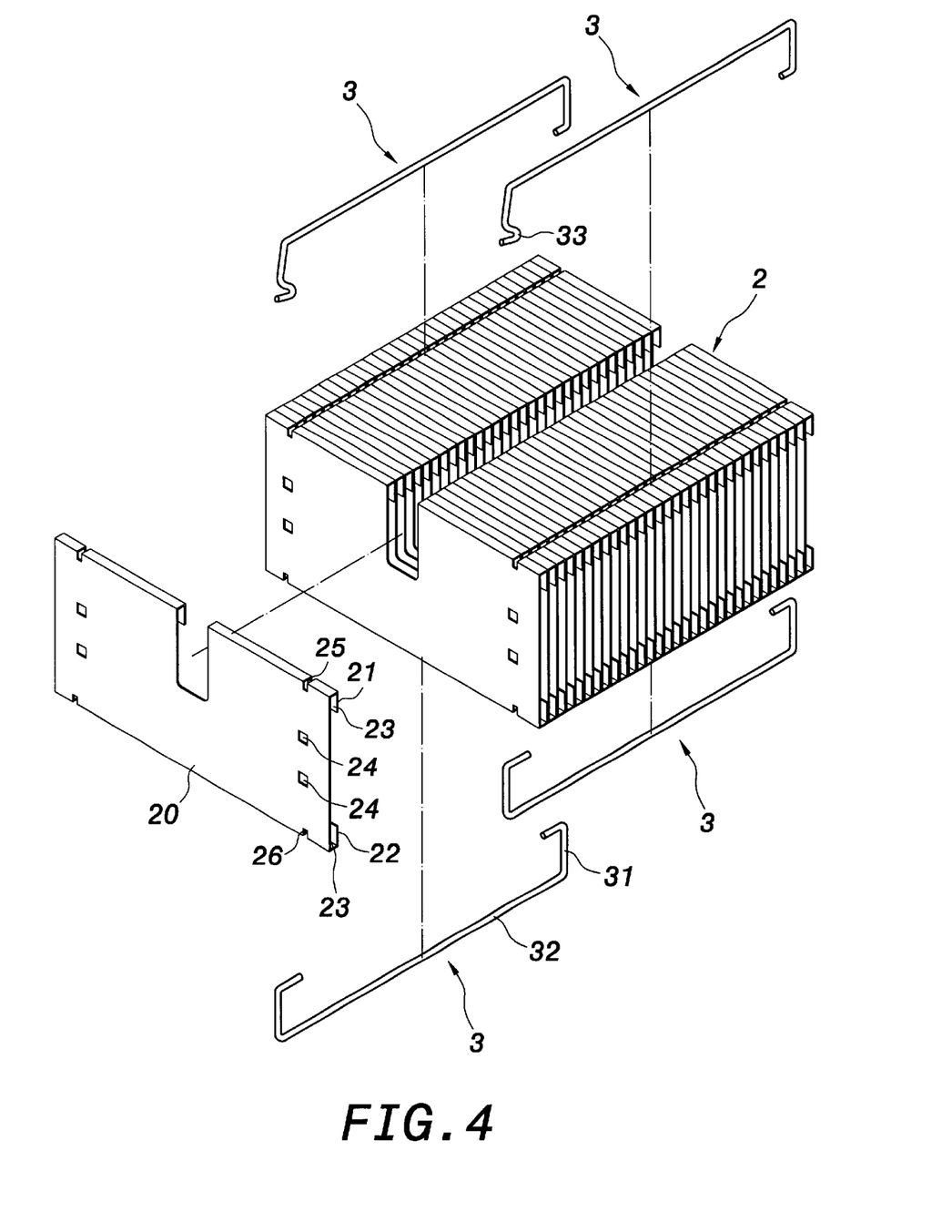
FIG. 4 is an exploded perspective view of FIG. 3.
Figure 5:
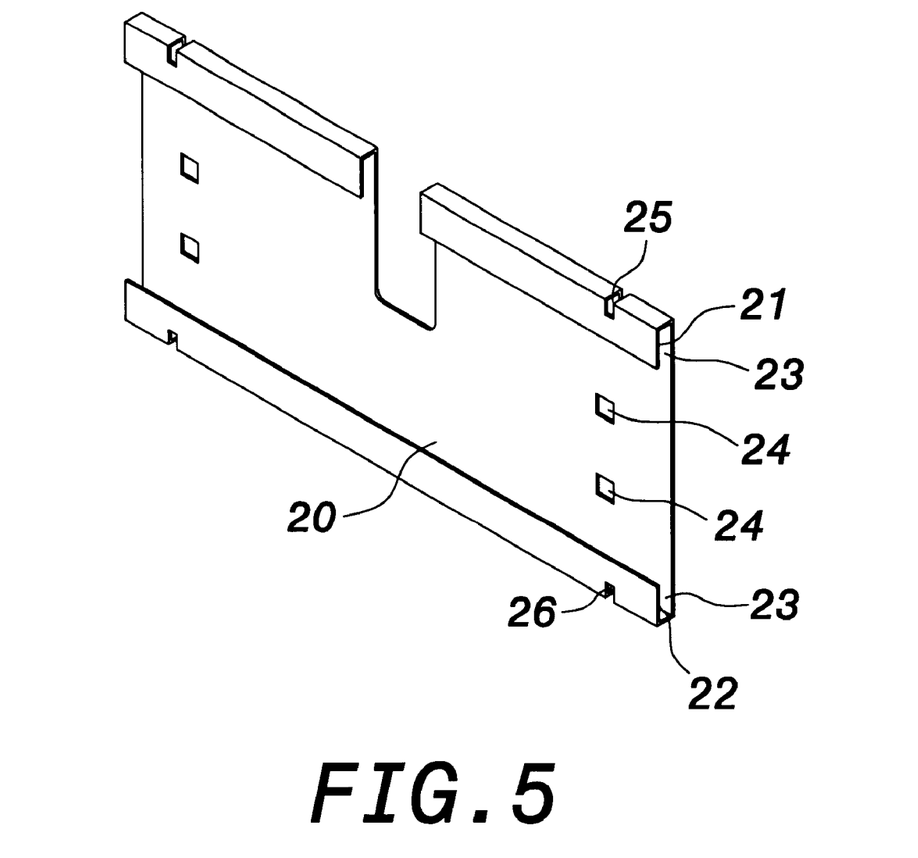
FIG. 5 is a perspective view of a heat-radiating fin of the present invention.
Figure 6:
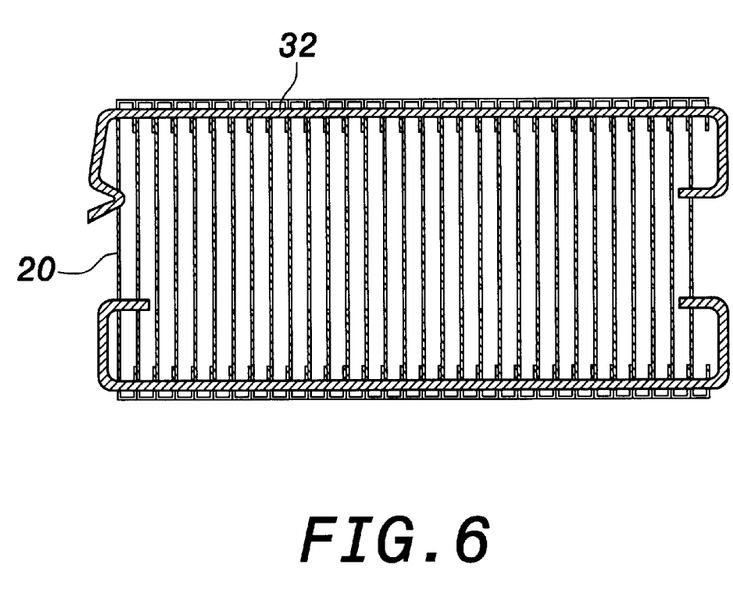
FIG. 6 is a lengthwise cross-sectional view of FIG. 3.
Figure 7:
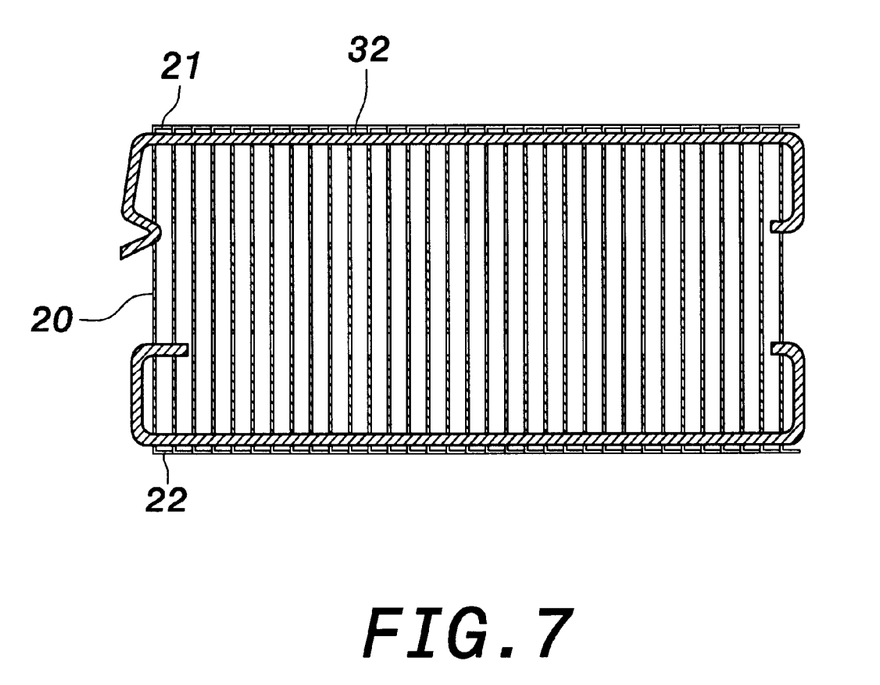
FIG. 7 is a cross-sectional view of another embodiment of the present invention.
Figure 8:
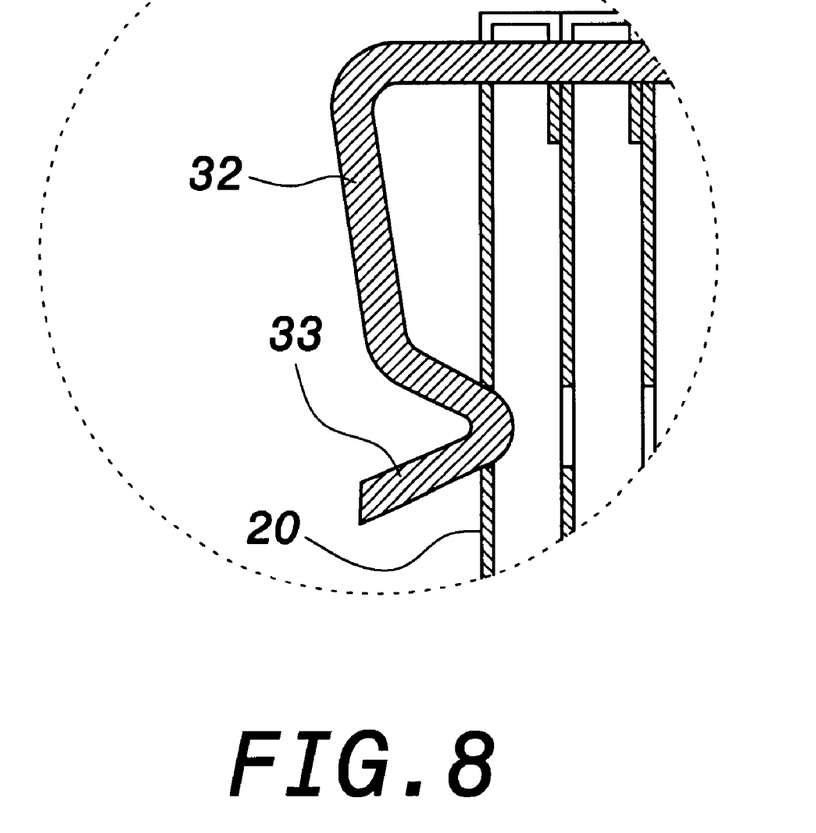
FIG. 8 is an enlarged view of a hook end of a retaining tool according to another embodiment of the present invention.

As shown in FIG. 7, the upper and lower bent portions 21 and 22 form right-angled bent portions, which are different from the barb-shaped bent portions shown in FIG. 4. Because outer ends of the bent portions projecting out transversally are lapped at edges of the adjacent fins in FIG. 7, and arc-shaped bent portions are L-shaped in FIG. 4, side edge portions and back edge portions are formed in these two embodiments. Outer surfaces of the back edge portions are directly lapped on surfaces of the adjacent fins to form a face-joining state, thereby achieving better assembling stability. Moreover, in addition to the right-angled bent types shown in the lower portion of FIG. 4, the hook end 31 of the retaining tool 3 can also form an obtuse-angled shape or an acute-angled shape shown in FIG. 8 to form a better retaining state.

To sum up, the present invention utilizes a plurality of retaining tools to retain a plurality of fins. Easy assembly and smooth arrangement between the retaining tools and the fins can be achieved. Moreover, the fins can be firmly stacked together. Because the fins are restricted by the retaining tools, the fins will not easily move. At least a retaining tool is provided to generate retaining effect. Therefore, very good use can be achieved in the present invention.

Although the present invention has been described with reference to the preferred embodiment thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

We claim:

1. A retaining structure of heat-radiating fins, comprising:
   a heat-radiating part formed by stacking a plurality of sheet type heat-radiating fins, each of said heat-radiating fins having an upper bent portion and a lower bent portion, said two bent portions forming a joining portion between two adjacent fins, each of said heat-radiating fins having at least a through hole and at least a groove; and
   at least a retaining tool, near two ends of said retaining tool being bent to form hook ends, said hook ends being retained in said through holes of corresponding fins, said retaining tool being embedded into said grooves of said fins.

2. The retaining structure of heat-radiating fins as claimed in claim 1, wherein said grooves of said fins are disposed at said bent portions.

3. The retaining structure of heat-radiating fins as claimed in claim 1, wherein said upper and lower bent portions of said fins are L-shaped.

4. The retaining structure of heat-radiating fins as claimed in claim 1, wherein said hook ends of said retaining tool are bent to form V-shaped portions, and tips of said V-shaped portions are retained in said through holes of said fins.

* * * * *